United States Patent
Miyawaki

(10) Patent No.: US 6,265,932 B1
(45) Date of Patent: Jul. 24, 2001

(54) SUBSTRATE CONTROL VOLTAGE CIRCUIT OF A SEMICONDUCTOR MEMORY

(75) Inventor: Masafumi Miyawaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/460,985

(22) Filed: Dec. 15, 1999

(30) Foreign Application Priority Data

Mar. 12, 1999 (JP) .................................................. 11-066685

(51) Int. Cl.[7] ...................................................... G05F 1/10
(52) U.S. Cl. ............................................. 327/535; 327/537
(58) Field of Search ..................................... 327/534, 535, 327/536, 537

(56) References Cited

U.S. PATENT DOCUMENTS

| | | | |
|---|---|---|---|
| 5,307,315 | * | 4/1994 | Oowaki et al. ................. 365/189.09 |
| 5,668,487 | * | 9/1997 | Chonan ................................. 327/537 |
| 5,874,851 | * | 2/1999 | Shiota .................................. 327/537 |
| 6,075,404 | * | 7/2000 | Shindoh et al. ..................... 327/537 |

FOREIGN PATENT DOCUMENTS 5-54650 * 3/1993 (JP) .

* cited by examiner

*Primary Examiner*—Terry D. Cunningham
(74) *Attorney, Agent, or Firm*—Jones Volentine, PLLC

(57) ABSTRACT

An object of the invention is to provide a semiconductor memory which is not susceptible to the change of a threshold value caused by variations in a fabricating process. The semiconductor memory comprises a memory cell part, a voltage generation circuit for generating a substrate voltage of the memory cell part, a threshold value detection circuit for outputting threshold value detection signals in response to a threshold value of a transistor formed on the memory cell part, and a voltage detection circuit for detecting the substrate voltage generated by the voltage generation circuit, outputting a voltage detection signal at a given voltage in response to the threshold value detection signals to stop the operation of the voltage generation circuit.

23 Claims, 2 Drawing Sheets

SUBSTRATE CONTROL VOLTAGE CIRCUIT OF A SEMICONDUCTOR MEMORY

BACKGROUND OF THE INVENTION

The invention relates to a substrate voltage control circuit of a semiconductor memory. In a semiconductor memory, the voltage on a substrate having a region where a memory cell is formed is controlled. As a conventional semiconductor device, there is a circuit as disclosed in Japanese Patent Laid-Open Publication No. 62-121996. In this circuit, a substrate bias generation circuit generates a voltage to be applied to a substrate, and a voltage detection circuit detects whether the voltage to be applied to the substrate reaches a given voltage value.

In a conventional semiconductor memory, a voltage to be applied to a substrate has a predetermined value. If a threshold value of a transistor is shifted owing to variations in a fabricating process, or the like, there has occurred a case where data is inferiorly written on a memory cell or written data has not been stored.

SUMMARY OF THE INVENTION

To solve the foregoing problem, a semiconductor memory of the invention comprises a memory cell part, a voltage generation circuit for generating a substrate voltage of the memory cell part, a threshold value detection circuit for outputting threshold value detection signals in response to a threshold value of a transistor formed on the memory cell part, and a voltage detection circuit for detecting the substrate voltage generated by the voltage generation circuit, outputting a voltage detection signal at a given voltage in response to the threshold value detection signals to stop the operation of the voltage generation circuit.

PREFERRED EMBODIMENT OF THE INVENTION

Figure 1:
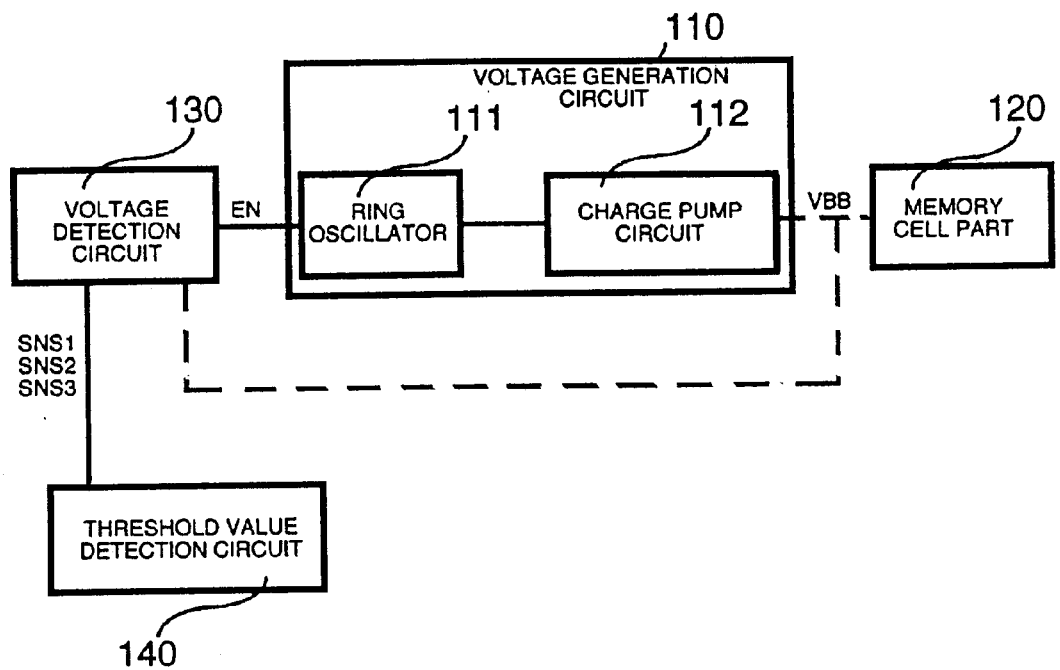
FIG. 1 is a block diagram of a semiconductor memory according to a preferred embodiment of the invention.

FIG. 1 is a block diagram showing a semiconductor memory according to a preferred embodiment of the invention.

The semiconductor memory is now described in detail with reference to FIG. 1.

In FIG. 1, a voltage generation circuit 110 comprises a ring oscillator 111, and a charge pump circuit 112. The charge pump circuit 112 outputs a voltage VBB to a substrate of a memory cell part 120. The substrate voltage VBB is also applied to a voltage detection circuit 130. The voltage detection circuit 130 outputs a voltage detection signal EN (enable) when the substrate voltage VBB becomes a given negative voltage. Upon reception of the voltage detection signal EN, the ring oscillator 111 stops oscillation. At this time, the substrate voltage VBB is established.

Figure 2:
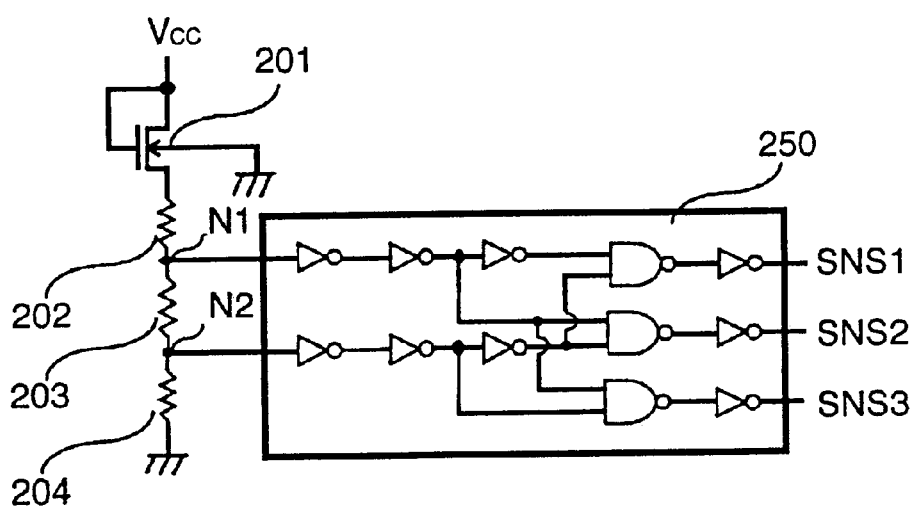
FIG. 2 is a circuit diagram of a threshold value detection circuit of the invention.

The voltage detection circuit 130 receives threshold value detection signals SNS1, SNS2, SNS.3 outputted respectively from a threshold value detection circuit 140 (see FIG.2). The given negative voltage at which the voltage detection circuit 130 outputs the voltage detection signal EN is determined by the threshold value detection signals SNS1, SNS2, SNS3.

FIG. 2 is a circuit diagram showing a threshold value detection circuit according to the invention. The threshold value detection circuit is now described.

The threshold value detection circuit comprises an N-type MOS transistor (NMOS) 201, resistors 202, 203, 204 and a logical circuit part 250. The NMOS transistor 201 is fabricated in the same process as an NMOS transistor formed on the memory cell part 120 shown in FIG. 1. A gate and a drain of the NMOS transistor 201 are connected to a power supply voltage Vcc and a substrate thereof is connected to a ground voltage Vss, and a source thereof is connected to the resistor 202. The resistor 202 is connected between the NMOS transistor 201 and the resistor 203. The resistor 203 is connected between the resistor 202 and the resistor 204. The resistor 204 is connected between the resistor 203 and the ground voltage Vss. Voltages at two points are applied to the logical circuit part 250. One point is a node N1 between the resistor 202 and the resistor 203, and the other point is a node N2 between the resistor 203 and the resistor 204. The logical circuit part 250 outputs the threshold value detection signals SNS1, SNS2, SNS3 in response to voltage levels at the node N1 and the node N2.

The operation of the threshold value detection circuit is now described in detail.

If the threshold value of the NMOS transistor 201 becomes larger than a set value, a voltage drop caused by a current flowing through the NMOS transistor 201 becomes large. The voltage levels at the node N2 and the node N1 become smaller than each set value. The logical circuit part 250 decides that it receives L level signals at two input terminals. The logical circuit part 250 outputs H level signal as the threshold value detection signal SNS1 and L level signals as the threshold value detection signals, SNS2, SNS3.

If the threshold value of the NMOS transistor 201 is close to the set value, a voltage drop caused by a current flowing through the NMOS transistor 201 is substantially the same as the set value. If the resistor 202 is set to an appropriate value, the voltage level at the node N1 becomes a value which is decided H level by the logical circuit part 250. Further, if the resistor 203 is set to an appropriate value, the voltage level at the node N2 becomes a value which is decided L level by the logical circuit part 250. Accordingly, the logical circuit part 250 receives L level voltage at one input terminal and H level voltage at the other input terminal. The logical circuit part 250 outputs H level signal as the threshold value detection signal SNS2 and L level signals as the threshold value detection signals SNS1, SNS3.

If the threshold value of the NMOS transistor 201 becomes smaller than the set value, the voltage drop caused by a current flowing through the NMOS transistor 201 become small. The voltage levels at the node N2 and node N1 also become high. The logical circuit part 250 decides that it receives H level signals at its two input terminals. The logical circuit part 250 outputs H level signal as the threshold value detection signal SNS3 and L level signals as the threshold value detection signals SNS1, SNS2.

The NMOS transistor 201 changes in the same manner as the change of a threshold value of a transistor provided on a memory cell part, because the NMOS transistor 201 is fabricated at the same time when the transistor on the memory cell part is fabricated. Since the substrate of the NMOS transistor 201 is connected to the ground voltage, it is not susceptible to the substrate voltage VBB of the memory cell part. The NMOS transistor 201 operates as a reference transistor for referring to the threshold value of the memory cell.

The resistors 202, 203, 204 operates as voltage regulating elements for regulating levels of voltages to be applied to the logical circuit part 250 in response to the change of the threshold value of the NMOS transistor 201.

Figure 3:
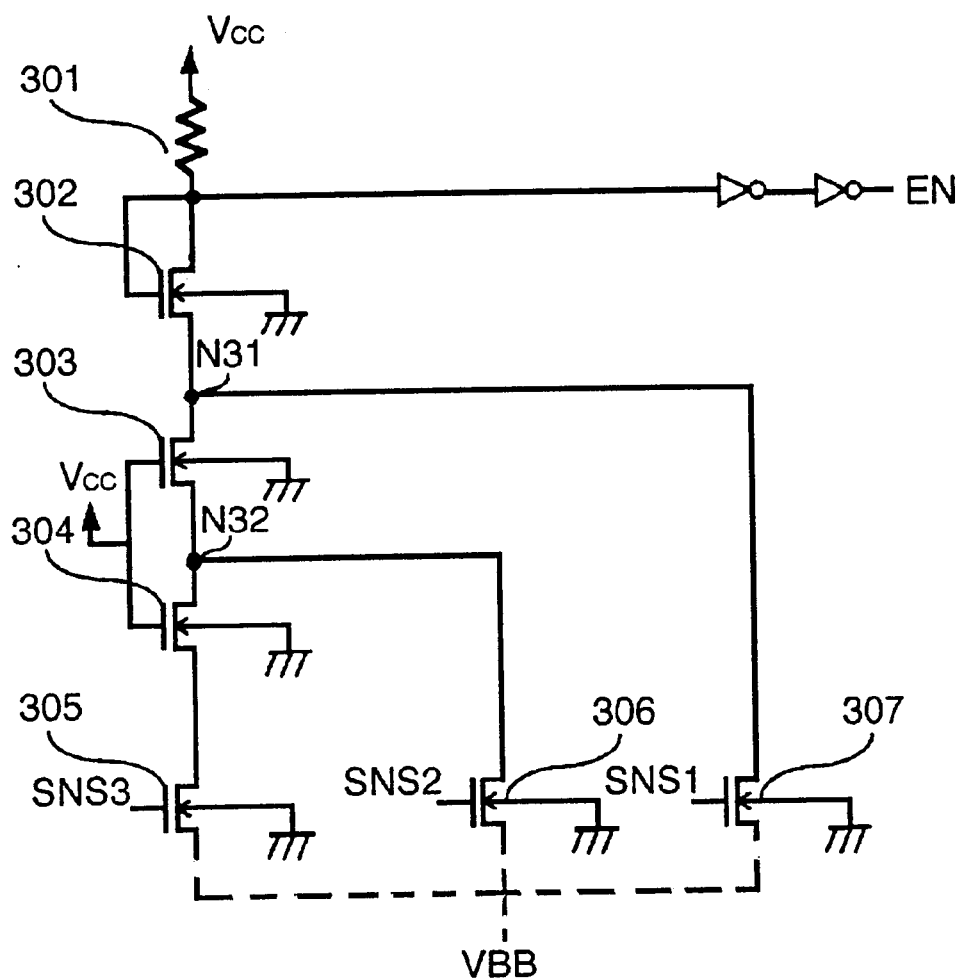
FIG. 3 is a circuit diagram of a voltage detection circuit of the invention.

FIG. 3 is a circuit diagram showing the voltage detection circuit of the invention. The voltage detection circuit decides the substrate voltage VBB by the threshold value detection signals SNS1, SNS2, SNS3. The voltage detection circuit is now described in detail with reference to FIG. 3.

The voltage detection circuit 300 comprises a resistor 301 and the six NMOS transistors 302 to 307.

The resistor 301 is connected between the power supply voltage Vcc and a terminal for outputting the voltage detection signal EN. The NMOS transistor 302 is connected between an output terminal and the NMOS transistor 303 while its gate is connected to the output terminal and its substrate is connected to the ground voltage Vss. The NMOS transistor 303 is connected between the NMOS transistor 302 and the NMOS transistor 304 while its gate is connected to the power supply voltage Vcc and its substrate is connected to the ground voltage Vss. The NMOS transistor 304 is connected to the NMOS transistor 303 and the NMOS transistor 305 while its gate is connected to the power supply voltage Vcc and its substrate is connected to the ground voltage Vss. A drain of the NMOS transistor 305 is connected to the NMOS transistor 304 and a source thereof is connected to a substrate voltage input terminal to which the substrate voltage VBB is applied while the threshold value detection signal SNS3 is supplied to a gate of the NMOS transistor 305 and a substrate thereof is connected to the ground voltage Vss. A drain of the NMOS transistor 306 is connected to a node N32 between the NMOS transistor 303 and the NMOS transistor 304 and a source thereof is connected to the substrate voltage input terminal while the threshold value detection signal SNS2 is supplied to a gate thereof and a substrate thereof is connected to the ground voltage Vss. A drain of the NMOS transistor 307 is connected to a node N31 between the NMOS transistor 302 and the NMOS transistor 303 and a source thereof is connected to the substrate voltage input terminal while the threshold value detection signal SNS1 is supplied to a gate thereof and a substrate thereof is connected to the ground voltage Vss.

The operation of the substrate voltage detection circuit is now described in detail.

If the threshold value of the NMOS transistor formed on the memory cell becomes larger than a set value, the threshold value detection signal SNS1 has H level and the threshold value detection signal SNS2 and the threshold value detection signal SNS3 have L level. The NMOS transistor 307 always becomes an ON resistor. A current path from the node N31 to the substrate voltage input terminal is formed. Even if the absolute value of the substrate voltage VBB is small, the voltage level of the output terminal becomes L level so that the voltage detection signal is outputted. The ring oscillator stops oscillation in response to the voltage detection signal so that the absolute value of the substrate voltage VBB is set to small one.

If the threshold value of the MOS transistor formed on the memory cell is close to the set value, the threshold value detection signal SNS2 has H level and the threshold value detection signals SNS1, SNS3 have L level. The NMOS transistor 306 always becomes an ON resistor. The current path from the node N31 to the substrate voltage input terminal is not formed but a current path from the node N32 to the substrate voltage input terminal is formed. A sufficient amount of current is forced to flow through the NMOS transistors 302, 303, 306 to render voltage level of the output terminal L level. If the absolute value of the substrate voltage VBB does not become large compared with the previous case, the voltage detection signal EN is not outputted. That is, if the substrate voltage VBB becomes a level of the order of the set value, the voltage detection signal is outputted. The ring oscillator stops oscillation in response to the voltage detection signal EN, and the substrate voltage VBB is set to the original set value.

If the threshold value of the NMOS transistor formed on the memory cell is smaller than the set value, the threshold value detection signal SNS3 has H level and the threshold value detection signal SNS1 and threshold value detection signal SNS2 have L level. A current path from an intermediate node to the substrate voltage input terminal is not formed. Accordingly, a sufficient amount of current is forced to flow through the NMOS transistors 302, 303, 304, 305 to render the voltage level of the output terminal L level. Accordingly, if the absolute value of the substrate voltage VBB does not become larger compared with the previous case, the voltage detection signal is not outputted. The ring oscillator stops oscillation in response to the voltage detection signal EN, and the substrate voltage VBB is set to a value which is larger than the original set value.

If the absolute value of the substrate voltage VBB is small, the threshold value of the NMOS transistor provided on the memory cell part becomes small. If the absolute value of the substrate voltage VBB is large, the threshold value of the NMOS transistor provided on the memory cell part becomes large.

According to the invention, the substrate voltage VBB changes in response to the threshold value of the NMOS transistor 201 in FIG. 2. Even if the threshold value of the NMOS transistor provided on the memory cell is changed owing to variations in the fabricating process, the threshold value can be rendered close to the set value when the substrate voltage VBB changes.

What is claimed is:

1. A semiconductor memory comprising:
   a memory cell part;
   a voltage generation circuit for generating a substrate voltage of said memory cell part;
   a threshold value detection circuit for outputting threshold value detections signals in response to a threshold value of a transistor formed on said memory cell part; and
   a voltage detection circuit for detecting the substrate voltage generated by said voltage generation circuit, and outputting a voltage detection signal at a given voltage in response to the threshold value detection signals to stop operation of said voltage generation circuit;
   wherein said threshold detection circuit comprises:
      a reference transistor fabricated at the same time when said transistor formed on said memory cell part is formed;
      voltage regulating elements for outputting voltage levels in response to a threshold value of said reference transistor; and
      a logical circuit part for outputting said threshold value detection signals in response to said levels.

2. The semiconductor memory according to claim 1, wherein said voltage detection circuit has a plurality of current paths between said power supply voltage and said substrate voltage input terminals and selects an arbitrary current path of said plurality of current paths in response to said threshold value detection signals.

3. A semiconductor memory comprising:

a memory cell part including a memory cell transistor;

a voltage generation circuit which generates a substrate voltage for said memory cell part, said voltage generation circuit being enabled in response to an enable signal;

a voltage detection circuit which outputs the enable signal in response to a threshold voltage detection signal and a level of the substrate voltage applied thereto; and a threshold voltage detection circuit, having a reference transistor formed by a same process as said memory cell transistor, which detects a predetermined voltage using said reference transistor and outputs the threshold voltage detection signal in response to the detected predetermined voltage.

4. A semiconductor memory according to claim 3, wherein said reference transistor is connected between first and second voltage sources.

5. A semiconductor memory according to claim 5, wherein said reference transistor operates as a diode.

6. A semiconductor memory according to claim 3, wherein said threshold voltage detection circuit includes:

a voltage regulating circuit which includes said reference transistor, and which outputs a regulating signal having a voltage level determined by a threshold voltage of said reference transistor; and a logical circuit which outputs the threshold voltage detection signal in response to the regulating signal.

7. A semiconductor memory according to claim 6, wherein said voltage regulating circuit further includes a plurality of resistive elements connected in series with said reference transistor between first and second voltage sources.

8. A semiconductor memory according to claim 3, wherein said reference transistor is an NMOS transistor.

9. A semiconductor memory according to claim 8, wherein said reference transistor has a substrate connected to a first voltage source.

10. A semiconductor memory comprising:

a memory cell part disposed on a semiconductor substrate, said memory cell part including a memory cell transistor;

a voltage generation circuit which applies a substrate voltage to said semiconductor substrate, said voltage generation circuit being enabled in response to an enable signal;

a voltage detection circuit which outputs the enable signal in response to a threshold voltage detection signal and a level of said substrate voltage applied thereto, said voltage detection circuit including a plurality of conductive paths which supply the substrate voltage, wherein one of said conductive paths is selected in response to the threshold voltage detection signal; and a threshold voltage detection circuit which outputs the voltage detection signal in response to a detected voltage thereof.

11. A semiconductor memory according to claim 10, wherein said threshold voltage detection circuit includes a reference transistor formed by a same process as said memory cell transistor, and wherein said threshold voltage detection circuit detects a predetermined voltage using said reference transistor.

12. A semiconductor memory according to claim 10, wherein each of said conductive paths has a different resistance value.

13. A semiconductor memory according to claim 12, wherein said voltage detection circuit includes:

a plurality of resistive elements connected in series between a first potential source and a first node through a second node and a third node; and a plurality of select transistors, each of which has a first terminal to which the substrate voltage is applied, a second terminal connected to one of said first and second nodes, and a control terminal which receives the threshold voltage detection signal.

14. A semiconductor memory according to claim 13, wherein said voltage detection circuit further includes an enable signal generator having an input terminal connected to said third mode and an output terminal which outputs the enable signal.

15. A semiconductor memory according to claim 13, wherein said resistive elements are formed by on-state transistors, each of said on-state transistors having gates to which a predetermined voltage is applied.

16. A semiconductor memory according to claim 15, wherein a predetermined constant voltage is applied to a substrate of said on-state transistors.

17. A semiconductor memory comprising:

a memory cell part including a memory cell transistor;

a voltage generation circuit which generates a substrate voltage for said memory cell part, said voltage generation circuit being enabled in response to an enable signal;

a voltage detection circuit which outputs the enable signal in response to a threshold voltage detection signal and a level of the substrate voltage applied thereto; and a threshold voltage detection circuit having a reference transistor, said reference transistor substantially formed at a same time as said memory cell transistor, wherein said threshold voltage detection circuit detects a predetermined voltage using the reference transistor and outputs the threshold voltage detection signal in response to the detected voltage thereof.

18. A semiconductor memory according to claim 17, wherein said reference transistor is connected between first and second voltage sources.

19. A semiconductor memory according to claim 18, wherein said reference transistor operates as a diode.

20. A semiconductor memory according to claim 17, wherein said threshold voltage detection circuit includes, a voltage regulating circuit having said reference transistor, said voltage regulating circuit outputting a regulating signal having a voltage level determined by a threshold voltage of said reference transistor; and a logical circuit outputting the threshold voltage detection signal in response to the regulating signal.

21. A semiconductor memory according to claim 20, wherein the voltage regulating circuit includes a plurality of resistive elements connected in series with said reference transistor between first and second voltage sources.

22. A semiconductor memory according to claim 21, wherein said reference transistor is an NMOS transistor.

23. A semiconductor memory according to claim 22, wherein said reference transistor has a substrate connected to a first voltage source.

* * * * *